United States Patent
Lu et al.

(10) Patent No.: US 6,361,407 B1
(45) Date of Patent: Mar. 26, 2002

(54) METHOD OF POLISHING A SEMICONDUCTOR WAFER

(75) Inventors: Yongqiang Lu, St. Peters; Kenneth Frank, St. Charles; Kevin Edwards, Chesterfield, all of MO (US)

(73) Assignee: MEMC Electronic Materials, Inc., St. Peters, MO (US)

( * ) Notice: Subject to any disclaimer, the term of this patent is extended or adjusted under 35 U.S.C. 154(b) by 0 days.

(21) Appl. No.: 09/631,089

(22) Filed: Aug. 2, 2000

(51) Int. Cl.[7] .................................. B24B 1/00
(52) U.S. Cl. ........................... 451/41; 451/60
(58) Field of Search .............................. 451/28, 41, 63, 451/60; 438/692, 693, 459, 974, 458, 691; 156/636.1, 645.1; 216/88, 89, 90, 91

(56) References Cited

U.S. PATENT DOCUMENTS

| | | | |
|---|---|---|---|
| 3,170,273 A | 2/1965 | Walsh et al. .................. 51/281 |
| 4,973,563 A | 11/1990 | Prigge et al. ................ 437/225 |
| 5,571,373 A | 11/1996 | Krishna et al. ........... 156/636.1 |
| 5,616,212 A | * 4/1997 | Isobe ......................... 438/693 |
| 5,704,987 A | 1/1998 | Huynh et al. .................. 134/6 |
| 6,080,641 A | * 6/2000 | Nihonmatsu et al. ....... 438/459 |
| 2001/0029104 A1 | * 10/2001 | Aoki .......................... 438/692 |

FOREIGN PATENT DOCUMENTS

WO   WO 98/50948   11/1998   ......... H01L/21/302

OTHER PUBLICATIONS

Fadeev, et al, "Trialkylsilane Monolayers Covalently Attached to Silicon Surfaces: Wettability Studies Indicating that Molecular Topography Contributes to Contact Angle Hysteresis", *Langmuir*, 1999, 15, pp. 3759–3766.

* cited by examiner

*Primary Examiner*—Derris H. Banks
(74) *Attorney, Agent, or Firm*—Senniger, Powers, Leavitt & Roedel

(57) ABSTRACT

A modified process for chemical/mechanical polishing semiconductor wafers is provided. The process includes polishing a surface of the wafer, contacting the polished surface of the wafer with a surfactant, and drying the surface of the disengaged wafer for a sufficient period of time before contacting the surface of the wafer with a rinse media or subsequent process liquid. The process reduces defects, including etching stains, on the polished surface of the wafer.

30 Claims, 4 Drawing Sheets

US 6,361,407 B1

METHOD OF POLISHING A SEMICONDUCTOR WAFER

BACKGROUND OF THE INVENTION

The present invention relates generally to methods of polishing semiconductor wafers, more particularly to chemical/mechanical polishing of silicon semiconductor wafers.

Silicon semiconductor wafers are the building blocks of integrated circuits. Silicon wafers are produced from crystal ingots which are grown and sliced into individual silicon wafers. The wafers are then subjected to grinding to planarize their front and back surfaces and etching to remove damage created by the slicing and grinding. At least one surface of the wafer is then subjected to chemical/mechanical polishing (CMP) before they are cleaned and inspected for packaging. The purpose of the CMP process in silicon wafer manufacturing is to remove surface damage caused during crystal slicing and chemical and mechanical shaping of the wafer and to achieve a highly reflective surface having the required flatness or planarity, which is of critical importance in the manufacture of high-density integrated circuits.

In general, CMP processing involves holding and pressing semiconductor wafers against a polishing pad mounted to a rotating turntable in the presence of a polishing solution. The polishing is achieved through a combination of pressure, temperature, mechanical abrasive force and chemical reaction. The polishing solution typically comprises an abrasive slurry and an alkaline etchant. During polishing, the abrasive slurry such as colloidal silica ($SiO_2$) or alumina ($Al_2O_3$) slurry mechanically abrades the semiconductor wafer surfaces while the alkaline etchant chemically reacts with the surface of the wafer to further remove damage and to achieve better surface quality.

Silicon wafers are typically polished using a CMP method including two or more polishing steps. The first step, or rough polishing, uses a relatively coarse slurry, aggressive chemistry, and a harder polishing pad for fast stock removal. Subsequent polishing steps or finish polishing uses finer slurry, reduced wafer-to-pad contact pressure, relatively less aggressive chemistry and a softer polishing pad for better surface quality. Conventionally, the wafer is rinsed at least once with deionized water between polishing steps to wash away residual chemicals and prevent the abrasive slurry particles from being carried over to the subsequent polishing step.

One of the major concerns with CMP methods is achieving sufficient reduction of the surface defect level on polished wafers. Defects during CMP may be caused by carryover of coarse slurry particles from one polishing step to the next, continued chemical reactions on the wafer surface, which may lead to etching stains due to the incomplete removal of polishing solution, and contamination from airborne chemicals. Defective wafers have to be rejected and therefore cause yield losses in the CMP process.

Several strategies have been designed to reduce surface defects formed during CMP processing. One example is quenching the polishing solution as disclosed by Krishna et al. in U.S. Pat. No. 5,571,373. In quenching, the surface of the wafer is contacted with an acidic quench solution at the end of the polishing step while the wafer is still engaged on the polishing pad. The quench solution acts to neutralize the polishing solution on the wafer surface. A surfactant may be included in the quench solution to help wet the wafer surface and make the wafer surface hydrophilic. A hydrophilic wafer surface allows for more efficient removal of residual slurry, thus providing the wafer with a higher resistance to the attachment of foreign objects on the wafer surface as has been suggested in PCT/US98/08936 and by Huynh et al., U.S. Pat. No. 5,704,987.

Another strategy as taught by Prigge et al., U.S. Pat. No. 4,973,563, is the formation of a hydrophobic protective film on the wafer surface by contacting the wafer with a surfactant such as alkyl silane or short chain alkyl alcohols after the application of the polishing slurry. When silane is used, the first molecule layer chemically adsorbs at the wafer surface as reported by Fadeev et al., Langmuir, 1999, vol. 15, p. 3759. A chemically adsorbed layer is difficult to remove and risks causing high organic contamination on the wafer surface. Thus, an additional oxidation step may be required to remove the chemically adsorbed organic film as described in U.S. Pat. No. 4,973,563. Likewise, alcohol is not preferred because a high concentration is required to form the hydrophobic protective film. This high consumption of reagents is costly and presents environmental issues.

Therefore, a need exists for a simple method of reducing surface defects, including etching stains, on polished semiconductor wafers.

SUMMARY OF THE INVENTION

Among the several objects of this invention, therefore, may be noted the provision of an improved semiconductor wafer polishing process; the provision of such a polishing process which improves the yield of a semiconductor production run; and the provision of such a polishing process wherein the occurrence of etching stains on the polished surface of the semiconductor wafers is substantially reduced and the wafer surfaces are substantially protected from airborne contaminants.

Briefly therefore, the present invention is directed to a method for polishing semiconductor wafers. The method comprises applying a polishing solution to a polishing pad and contacting the polishing pad and the polishing solution with a surface of a semiconductor wafer as the wafer moves relative to the polishing pad to polish the surface of the wafer. A surfactant is applied to the polished surface of the wafer and the wafer is disengaged from the polishing pad. After application of the surfactant to the polished surface of the wafer, the polished surface of the disengaged wafer is dried for a period of at least about 20 seconds prior to contacting the polished surface of the wafer with a subsequent process liquid such as a rinse media (e.g., deionized water) or a polishing solution in a subsequent polishing step.

The present invention is further directed to a process for polishing a semiconductor wafer including at least two polishing steps. The method comprises applying a first polishing solution to a first polishing pad and contacting the first polishing pad and the first polishing solution with a surface of a semiconductor wafer as the wafer moves relative to the polishing pad to polish the surface of the wafer. An acidic quench solution is applied to the wafer to neutralize the first polishing solution and a water-soluble, polyoxyethylene glycol surfactant is applied to the polished surface of the wafer. The wafer is disengaged from the polishing pad. After application of the surfactant to the polished surface of the wafer, the polished surface of the disengaged wafer is dried for a period of at least about 20 seconds prior to contacting the polished surface of the wafer with a rinse media. A second polishing solution is then applied to a second polishing pad and the rinsed, polished surface of the wafer is contacted with the second polishing pad and the second polishing solution as the wafer moves relative to the polishing pad to further polish the surface of the wafer.

The present invention is still further directed to a method of polishing a semiconductor wafer wherein a substantially continuous hydrophobic protective layer is formed across the polished surface of the wafer. The method comprises applying a polishing solution to a polishing pad and contacting the polishing pad and the polishing solution with a surface of the wafer as the wafer moves relative to the polishing pad to polish the surface of the wafer. A water-soluble polyoxyethylene glycol surfactant is applied to the polished surface of the wafer. The wafer is disengaged from the polishing pad and a substantially continuous hydrophobic layer comprising the polyoxyethylene glycol surfactant is formed across the polished surface of the disengaged wafer.

Other objects and features of this invention will be in part apparent and in part pointed out hereinafter.

DETAILED DESCRIPTION OF THE PREFERRED EMBODIMENTS

In accordance with the present invention, it has been discovered that surface defects after chemical/mechanical polishing of a semiconductor wafer can be significantly reduced by contacting the polished surface of the wafer with a surfactant and allowing the wafer surface disengaged from the polishing pad to dry for a period of time before the surface of the wafer is contacted with a subsequent process liquid (e.g., a rinse media or a subsequent polishing solution). The present invention can be used to modify conventional, multi-step CMP methods used to polish semiconductor wafers. The method of the present invention reduces etching stains on semiconductor wafers after CMP processing.

Figure 1:
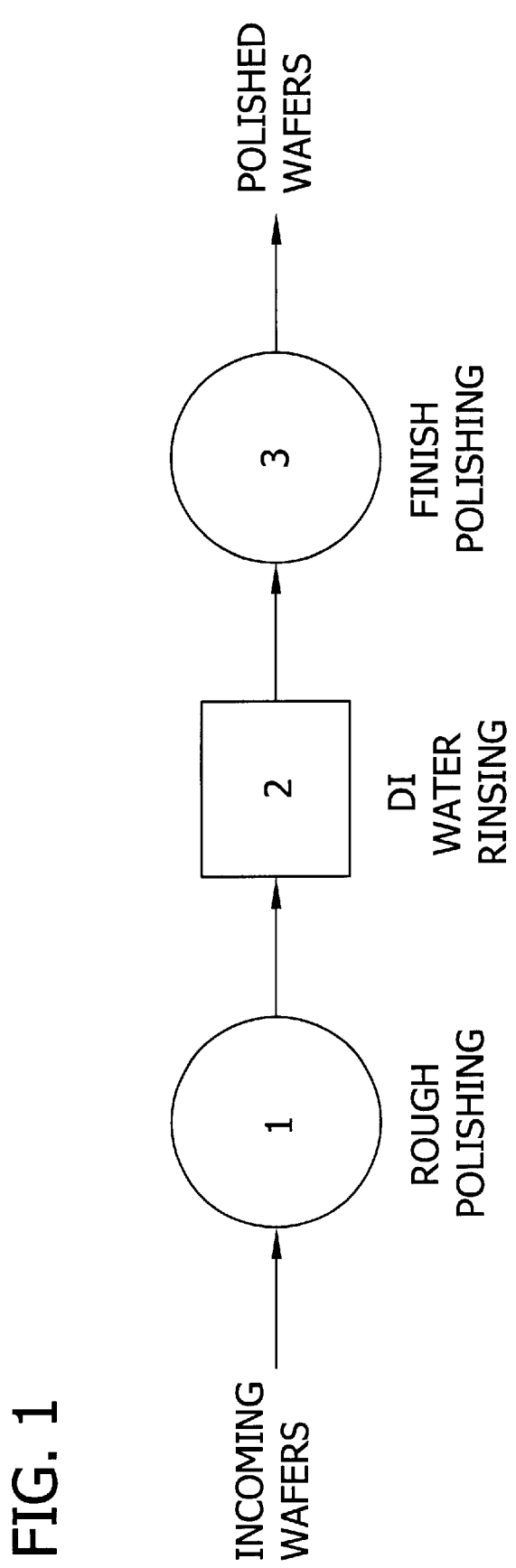
FIG. 1 is a simplified process flowsheet for a two-step CMP method of polishing a semiconductor wafer.

Silicon wafers are typically polished using a multi-step CMP procedure in which a rough polishing step is followed by one or more milder polishing steps (e.g., finish polishing). A two-step CMP process is illustrated in FIG. 1. The first step, the rough polishing, uses a relatively coarse polishing slurry, aggressive etchant chemistry, and relatively hard polishing pad for fast stock removal from the wafer surface. The second step, the finish polishing, uses finer abrading agents in the slurry, relatively less aggressive etchant chemistry, and a softer, high nap polishing pad for better surface quality. Typically, the polished wafer surface is rinsed with deionized water after rough polishing to wash away residual chemicals and prevent slurry particles from being carried over to subsequent polishing steps.

Polishing may be carried out using a single-side or double-side polishing apparatus. In single-side polishing, the wafer is first wax bonded to a ceramic polishing block which is then mounted on the arm of the polisher. As the polishing begins, the polisher arm is lowered until the wafer surface comes into contact with the polishing pad on the turntable of the polisher at the desired contact pressure. The turntable rotates while polishing solution is dispensed onto the pad surface such that the polishing pad and the polishing solution contact a surface of the wafer as the wafer moves relative to the polishing pad to polish the surface of the wafer. Alternatively, in a double-side polishing apparatus, a wafer is placed in a carrier and two polishing pads are brought into contact with both surfaces of the wafer. The polishing pads and the wafer carrier are rotated while the polishing solution is dispensed onto the pads. Any single or double-side polisher typically used in the semiconductor industry can be used in practicing the method of the present invention. Suitable commercially available polishers are manufactured by Speedfam, R. H. Strausburgh, Westech Systems, and Lem Research Inc. The operating conditions, such as the polishing time, wafer-to-pad contact pressure, rates of rotation and temperature will vary from one application to the next and are readily determined by one skilled in the art.

Polishing solutions typically comprise a slurry of abrasive fine particles such as colloidal silica ($SiO_2$), alumina ($Al_2O_3$) or cesium oxide (CsO) combined with an alkaline etchant. In a two-step CMP process, the rough polishing solution typically includes a sodium-stabilized colloidal silica slurry. Such slurries are well known in the art, and have been described in U.S. Pat. No. 3,170,273. Preferred sodium-stabilized slurries are Syton HT-50 and Syton HT-65, both of which are commercially available from E. I. du Pont de Nemours & Company. Syton HT-50 has a silica content of about 49.2 to about 50.5 percent and a particle size of about 0.035 to about 0.050 $\mu$m. The finish polishing solution typically includes an ammonia-stabilized colloidal silica slurry. Preferred ammonia-stabilized slurries include Glanzox 3900 or Glanzox 3950, both of which are commercially available from Fujimi, Inc. of Aichi Pref. 452, Japan. These products have a silica content of about 8 percent to about 20 percent and a particle size ranging from about 0.025 to about 0.035 $\mu$m. As is known by those skilled in the art, depending upon the silica content of the polishing slurry, it may be necessary to dilute the slurry with deionized water in order to obtain the desired silica content. The sodium or ammonia-stabilized colloidal silica slurry is typically dispensed onto the polishing pad at a flow rate ranging from about 50 ml/min to about 1000 ml/min, more preferably at a flow rate ranging from about 200 ml/min to about 500 ml/min.

During rough polishing, an amine accelerant and an alkaline etchant are dispensed onto the polishing pad along with the sodium-stabilized colloidal silica slurry as part of the polishing solution. The alkaline etchant may be selected from the group consisting of metal hydroxides such as potassium hydroxide, sodium hydroxide, and alkaline salts, such as, potassium carbonate and sodium carbonate. The amine may be selected from a group consisting of aniline, diphenyl amine, ethyl amine, ethylene diamine and trimethyl amine. Preferably, the amine accelerant is ethylene diamine and the alkaline etchant is potassium hydroxide and a caustic solution comprising ethylene diamine and potassium hydroxide having a pH ranging from about 10 to about 14 is dispensed onto the polishing pad. For example, a suitable solution can include from about 1 percent by weight to about 1.5 percent by weight potassium hydroxide, from about 0.5 percent by weight to about 1.3 percent by weight ethylene diamine and the remainder deionized water. The caustic solution comprising the amine accelerant and alkaline etchant is dispensed onto the polishing pad at a flow rate of from about 100 ml/min to about 500 ml/min.

Polishing solutions including colloidal silica slurries, amine accelerants and alkaline etchants used in CMP processing and how they vary from one polishing step to the next in multi-step CMP processes are well known in the art and the precise composition of the polishing solutions used in the practice of the present invention is not narrowly critical.

The colloidal silica slurry and other components of the polishing solution are dispensed onto a polyurethane impregnated felt pad, such as a Suba H2 pad which is commercially available from Rodel of Scottsdale, Ariz. In a double-side polishing apparatus, Rodel Suba H2 regular pads are preferably used on the bottom platen of the polisher while Rodel Suba H2 embossed pads are used on the top platen. Alternatively, other polishing pads, such as Rodel Suba 600, 800, and 850 may be used. Appropriate polishing pads for use in rough polishing or finish polishing are well known in the art. Typically, different polishing pads and polishing apparatus are used in each polishing step.

Generally, the surface of the wafer is rough polished at about 40° to about 60° C. for about 10 minutes to about 30 minutes. Rough polishing reduces the surface roughness of the wafer, typically removing from about 7 $\mu$m to about 30 $\mu$m of silicon from the wafer surface.

The surface of the wafer is preferably contacted with an acidic quench solution between polishing steps to neutralize and control the reaction of the polishing solution on the surface of the wafer. The acidic quench solution may be applied to the pad for a time period of about 2 minutes to about 6 minutes to neutralize the alkaline etchant and slurry that was applied to the wafer. The acidic quench solution comprises an organic or inorganic acid or mixture thereof. A representative quench solution is an aqueous acetic acid or sulfuric acid solution having a pH of about 3 to about 4. Other chemicals such as isopropanol and/or hydrogen peroxide may be added to the quench solution. Generally, the acidic quench solution is dispensed onto the polishing pad at a flow rate ranging from about 700 ml/min to about 1,500 ml/min.

In the practice of the present invention, a surfactant is applied to the polished surface of the wafer between polishing steps. Typically, any water-soluble surfactant which is not chemically reactive with silica or silicon and which does not chemically adsorb on the surface of the wafer may be used. For example, suitable surfactants are generally characterized as those comprising a hydrophobic base and a polar functional group and may be generally represented by the formula R-P, wherein R is a hydrophobic base selected from the group consisting of $C_1$ to $C_{18}$ alkyl, alkene and aryl, preferably straight chain alkyl or alkene, and P is a polar functionality selected from the group consisting of —OH, —COOH, —$SO_3$, —$SO_4$ and —$NH_2$. Specific examples of suitable water-soluble surfactants include polyoxyethylene glycols, sodium dodecylsulfate, fatty acids and fatty acid sodium salts.

Preferably, the surfactant used in the present invention is a water-soluble polyoxyethylene glycol represented by the general formula $C_nH_{2n+1}$—$(OCH_2CH_2)_m$—OH. Any water-soluble polyoxyethylene glycol of the previous formula will work in the present invention, but more preferably the surfactant is a polyoxyethylene glycol of the previous formula wherein n is from 2 to 18 and m is from 3 to 20,000, more preferably from 20 to 20,000. A suitable polyoxyethylene glycol is a polyether polyol having an average molecular weight of from about 100,000 to about 1,000,000. A preferred surfactant is POLYOX WSR N-3000, a water-soluble resin commercially available from Union Carbide and having a molecular weight of about 400,000. The surfactant is applied to the polished surface of the wafer at a concentration ranging from about 0.03 to about 5.0 percent by weight. Preferably, the surfactant contacted with the surface of the wafer has a concentration of about 0.03 to about 1.0 percent by weight. Most preferably, the surfactant concentration ranges from about 0.1 to about 0.5 percent by weight.

The surfactant can be applied to the surface of the wafer while the wafer is engaged on the polishing pad. For example, the surfactant can be applied as a component of the acidic quench solution dispensed on the polishing pad after rough polishing. The wafer is then disengaged from the polishing pad in preparation for the next polishing step. Alternatively, the surfactant may be applied to the rough polished surface of the wafer after it has been disengaged from the polishing pad.

In the practice of the present invention, it has been found that allowing the polished surface of the wafer to dry for a period of time after disengaging the wafer from the polishing pad and after application of the surfactant reduces the number of etching stains formed on the polished wafer surface and protects the polished wafer surface from contamination. More particularly, it has been found that the polished surface of the disengaged wafer should be dried at ambient temperature for a period of at least about 20 seconds before contacting the polished surface of the wafer with a subsequent process liquid such as a rinse media (e.g., deionized water) or a subsequent polishing solution (e.g., a finish polishing solution). The minimum drying time to reduce etching stains on the polished wafer surface is dependent upon the drying environment. If the wafer is actively dried, for example, by exposing the polished surface of the disengaged wafer to an infrared lamp or by contacting it with a flow of warm drying gas, the drying time may be as short as about 10 seconds. However, drying at ambient temperature is preferred over active drying and in a typical ambient temperature drying environment, the surface of the disengaged wafer is preferably allowed to dry for a period of at least about 30 seconds, more preferably at least about 60 seconds and optimally at least about 120 seconds before the surface of the wafer is contacted with a rinse media or other subsequent process liquid. It has been found that allowing the surfactant to dry on the disengaged surface of the wafer for a period of at least about 20 seconds before contacting the polished wafer surface with a subsequent process liquid will decrease the surface defect rate about 8 to 10 fold as compared to a wafer that is rinsed after a shorter period of time following application of a surfactant. It should be understood that although the polished surface of the disengaged wafer is allowed to dry for a period of time after application of the surfactant as described above, the polished surface of the wafer is not necessarily free of liquid (e.g., surfactant solution) at the end of the prescribed drying period.

In the practice of the present invention, other than process throughput limitations, there is believed to be no upper limit on how long the disengaged surface of the polished wafer can be dried after application of the surfactant. For example, allowing the surfactant on a rough polished wafer surface to dry for a period of longer than about 60 seconds, up to and including more than about 120 minutes does not have an adverse effect on the ability of the invention to reduce wafer surface defects. However, an extended drying period may cause unwanted delays in the overall CMP process. In CMP processing, the polishing time during which the wafer is engaged on the polishing pad as the wafer moves relative to the pad is the process limiting step, typically requiring from about 5 minutes to about 30 minutes per polishing step. Thus, as the optimal drying time at ambient drying temperature is at least about 120 seconds, it is not contemplated that allowing the wafers to dry in accordance with the present invention will inhibit process throughput in any way.

Figure 3A:
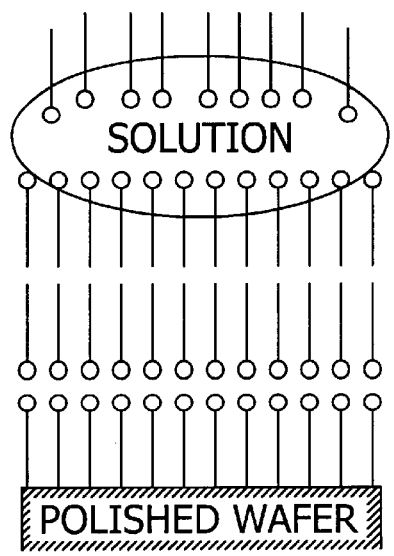
FIG. 3a is a schematic of a theoretical wafer surface immediately following application of a surfactant.
Figure 3B:
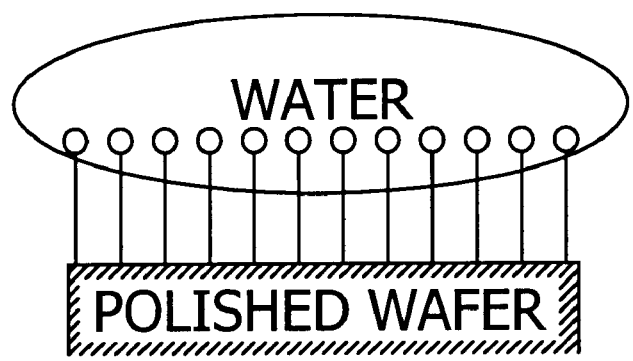
FIG. 3b is a schematic of the theoretical wafer surface shown in FIG. 3a after the wafer has been rinsed with deionized water immediately following application of the surfactant.
Figure 3C:
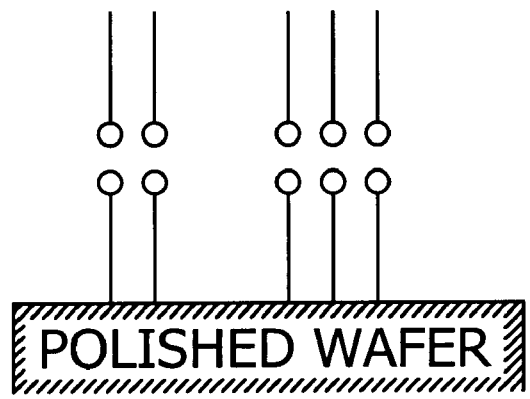
FIG. 3c is a schematic of the theoretical wafer surface shown in FIG. 3b after drying in ambient air.

Without being limited to a particular theory, it is believed that when a surfactant is applied to the polished surface of a wafer and thereafter allowed to dry for a period of at least about 20 seconds, a substantially continuous hydrophobic layer is formed across the wafer surface. Immediately upon applying the surfactant to the surface of the wafer, a multi-molecule layer is present in solution on the wafer surface as depicted in FIG. 3a. This wetted wafer surface is hydrophilic. However, a hydrophilic wafer surface is thermodynamically unstable, so the molecules on the wafer surface begin to spontaneously self rearrange as the wafer surface dries. If the wafer surface is rinsed with deionized water or another process liquid too soon after applying the surfactant, the multi-molecule layer of FIG. 3a is washed to a mono-molecule layer with the hydrophilic groups of surfactant pointing away from the surface as depicted in FIG. 3b. The mono-molecule layer then spontaneously undergoes a self rearrangement to lower the system energy because a mono-molecule layer of surfactant with the hydrophilic group pointing away is a thermodynamically unstable system. Then, as the wafer surface dries during handling between rinsing and subsequent polishing, a patchwork of exposed areas of bare wafer surface and multi-molecule surfactant spots is created on the surface as shown in FIG. 3c. The non-uniformly-covered wafer surfaces are undesirable because they are vulnerable to airborne chemical mists during wafer handling and they will experience uneven chemical reaction during subsequent CMP processing which results in etching stains.

Figure 3D:
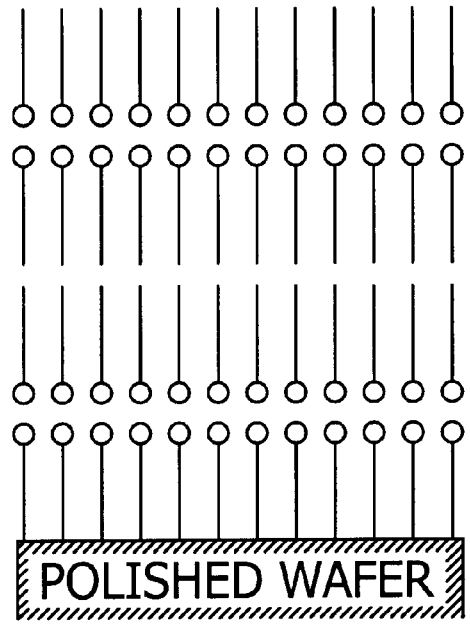
FIG. 3d is a schematic of the theoretical wafer surface shown in FIG. 3a that has been allowed to dry in ambient air after application of the surfactant in accordance with the present invention.
Figure 3E:
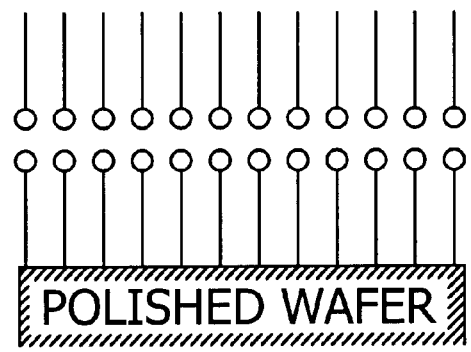
FIG. 3e is a schematic of the theoretical wafer surface shown in FIG. 3d after rinsing with deionized water.

If, however, the surfactant is allowed to dry on the polished surface of the wafer after being disengaged from the polishing pad for a period of at least about 20 seconds, the initial multi-molecule layer on the wafer surface rearranges to form a substantially continuous hydrophobic protective film across the wafer surface as depicted in FIG. 3d. Under this condition, the protective film is more resistant to subsequent water rinsing or contact with other process liquids. Thus, a substantially continuous, hydrophobic surfactant layer remains across the wafer surface as shown in FIG. 3e after rinsing with deionized water. Wafers with a substantially continuous hydrophobic surfactant film are better protected from airborne mists and undergo uniform reaction during subsequent CMP processing to reduce wafer defects such as etching stains.

In the preceding description, the present invention has been described in the context of a conventional two-step CMP process including rough polishing followed by finish polishing. However, it should be understood that the present invention can be used between consecutive polishing steps of any CMP processing regimen to reduce wafer defects. The present invention may be applied after final polishing such that the substantially continuous hydrophobic surfactant layer formed across the surface of the polished wafer may better protect the wafer from contamination during subsequent handling. Furthermore, the current invention can also be applied in CMP methods that do not include neutralizing the polishing solution (e.g., abrasive slurry with or without an alkaline etchant) with a quench solution. When no quench solution is used, the surface of the wafer is contacted with a surfactant solution immediately after the wafer is disengaged from the polishing pad. Then, allowing the polished surface of the wafer to dry for a period of at least about 20 seconds at ambient temperature is equally effective in reducing etching stain defects on the surface of the wafer.

The invention is described hereinafter in more detail by way of examples. The following examples are merely for the purpose of illustration and are not to be regarded as limiting the scope of the invention or manner in which it may be practiced.

EXAMPLE 1

Silicon semiconductor wafers were mounted on a ceramic block and rough polished on a Mark 8A polisher apparatus with a hard polyurethane pad (Suba 850 manufactured by Rodel of Scottsdale, Ariz.). Sodium-stabilized colloidal silica slurry (Syton HT-65 from E. I. duPont de Nemours & Co.) was applied to the polishing pad at a rate of about 300 ml/min. In addition to the weight of the polisher arm and the ceramic block, the air pressure was increased during rough polishing such that the total pressure applied to the wafer surfaces was about 6.4 lb/in$^2$ (about 4.4 N/cm$^2$). An amine reinforced alkaline etchant (ethylene diamine enhanced KOH) was applied to the polishing pad simultaneously with the abrasive slurry at a flow rate of about 450 ml/min. The wafers were rough polished for about 6 minutes while the temperature on the polishing table was controlled within the range of from about 55° to about 62° C.

After about 6 minutes, the increased air pressure was discontinued and an acidic quenching solution was applied to the polishing pad. The quench solution was an aqueous acetic acid solution having a pH of about 3.5 and containing about 0.1 percent by weight of a surfactant (POLYOX WSR N-3000) and about 0.25 percent by weight hydrogen peroxide. The quench solution was applied at a flow rate of about 1000 ml/min for about 180 seconds to neutralize the slurry and the alkaline etchant that was present on the polishing pad. The wafers were then disengaged from the polishing pad and dried in air at room temperature for about 180 seconds.

After drying, the wafers were rinsed with deionized water at a flow rate of about 1 gal/min (3.78 L/min) for about 60 seconds and immediately finish polished using a soft polyurethane pad (UR-100 from Rodel). An ammonia-stabilized colloidal silica slurry having an average particle size of about 0.03 microns (Glanzox from Fujimi, Inc. of Japan) was applied to the finish polishing pad at a flow rate of about 1000 ml/min. An amine reinforced alkaline etchant (ethylene diamine enhanced KOH) was applied simultaneously with the slurry at a flow rate of about 100 ml/min. In addition to the weight of the polisher arm and the ceramic block, the air pressure was increased during finish polishing such that the total pressure applied to the wafer surfaces was about 2.8 lb/in$^2$ (about 1.9 N/cm$^2$). During finish polishing, the temperature on the polishing table was controlled in the range of from about 32° to about 35° C.

Figure 2:
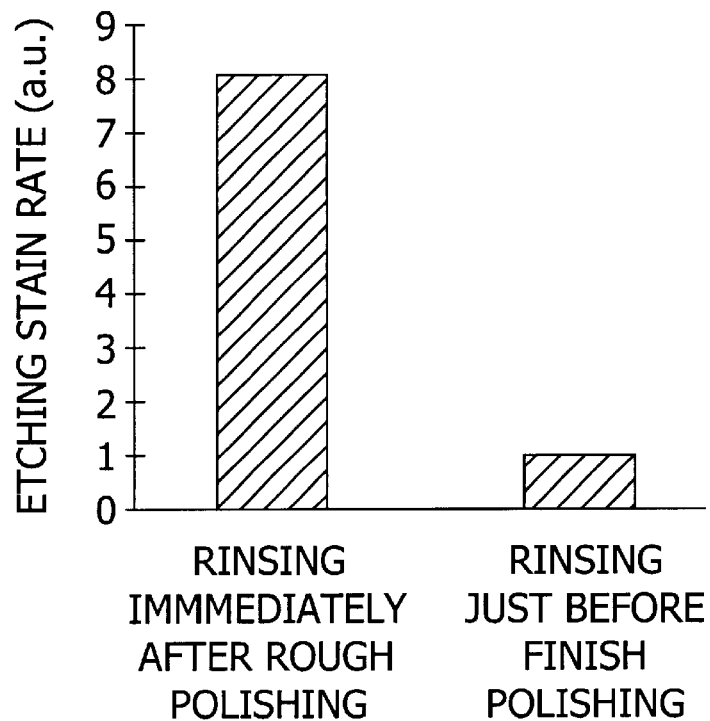
FIG. 2 is a graph illustrating the decreased etching stain rate obtained by polishing semiconductor wafers in accordance with the present invention as demonstrated in Example 1.

After about 150 seconds, the increased air pressure was discontinued and the quenching solution described above was applied to the finish polishing pad at a flow rate of about 750 ml/min for a period of about 180 seconds. The wafers were then disengaged from the polishing pad and immediately rinsed with deionized water before being cleaned and electronically inspected for defects. As shown in FIG. 2, the wafers polished in the above example showed 8 to 10 times less etching stain defects than wafers polished without a sufficient drying period between contacting the rough polished surface of the wafers with a surfactant and subsequent rinsing before finish polishing.

EXAMPLE 2

Silicon semiconductor wafers were mounted on a ceramic block and rough polished on a Mark 8A polisher apparatus with a hard polyurethane pad (Suba 850 manufactured by Rodel of Scottsdale, Ariz.). Sodium-stabilized colloidal silica slurry (Syton HT-65 from E. I. duPont de Nemours & Co.) was applied to the polishing pad at a rate of about 300 ml/min. In addition to the weight of the polisher arm and the ceramic block, the air pressure was increased during rough polishing such that the total pressure applied to the wafer surfaces was about 6.4 lb/in$^2$ (about 4.4 N/cm$^2$). An amine reinforced alkaline etchant (ethylene diamine enhanced KOH) was applied to the polishing pad simultaneously with the abrasive slurry at a flow rate of about 450 ml/min. The wafers were rough polished for about 6 minutes while the temperature on the polishing table was controlled within the range of from about 55° to about 62° C.

After about 6 minutes, the increased air pressure was discontinued and an acidic quenching solution was applied to the polishing pad. The quench solution was an aqueous acetic acid solution having a pH of about 3.5 and containing about 0.25 percent by weight hydrogen peroxide. The quench solution was applied at a flow rate of about 1000 ml/min for a period of about 180 seconds to neutralize the slurry and the alkaline etchant that was present on the polishing pad. The wafers were then disengaged from the polishing pad and an aqueous solution comprising about 0.1 percent by weight of a surfactant (POLYOX WSR N-3000) was applied to the rough polished surface of the wafers at a flow rate of about 1000 ml/min for a period of about 180 seconds. The disengaged wafers were then dried in air at room temperature for about 180 seconds.

After drying, the wafers were immediately finish polished using a soft polyurethane pad (UR-100 from Rodel). An ammonia-stabilized colloidal silica slurry having an average particle size of about 0.03 microns (Glanzox from Fujimi, Inc. of Japan) was applied to the finish polishing pad at a flow rate of about 1000 ml/min. An amine reinforced alkaline etchant (ethylene diamine enhanced KOH) was applied simultaneously with the slurry at a flow rate of about 100 ml/min. In addition to the weight of the polisher arm and the ceramic block, the air pressure was increased during finish polishing such that the total pressure applied to the wafer surfaces was about 2.8 lb/in$^2$ (about 1.9 N/cm$^2$). During finish polishing, the temperature on the polishing table was controlled in the range of from about 32° to about 35° C.

After about 150 seconds, the increased air pressure was discontinued and the quenching solution described in Example 1 (an aqueous acetic acid solution having a pH of about 3.5 and containing about 0.1 percent by weight of a surfactant and about 0.25 percent by weight hydrogen peroxide) was applied to the finish polishing pad at a flow rate of about 750 ml/min for a period of about 180 seconds. The wafers were disengaged from the finish polishing pad and immediately rinsed with deionized water before being cleaned and electronically inspected for defects. The polished wafers of Example 2 showed results similar to those of Example 1 (FIG. 2). The wafers had 8 to 10 times less etching stain defects than wafers polished without a sufficient drying period between contacting the rough polished surface of the disengaged wafer with a surfactant and subsequent finish polishing.

What is claimed:

1. A method of polishing a semiconductor wafer, the method comprising the steps of:
    applying a polishing solution to a polishing pad;
    contacting the polishing pad and the polishing solution with a surface of the wafer as the wafer moves relative to the polishing pad to polish the surface of the wafer;
    applying a surfactant to the polished surface of the wafer;
    disengaging the wafer from the polishing pad; and,
    after application of the surfactant to the polished surface of the wafer, drying the polished surface of the disengaged wafer for a period of at least about 20 seconds prior to contacting the polished surface of the wafer with a subsequent process liquid.

2. A method as set forth in claim 1 wherein the polished surface of the disengaged wafer is dried at ambient temperature for a period of at least about 30 seconds prior to contacting the polished surface of the wafer with the subsequent process liquid.

3. A method as set forth in claim 1 wherein the polished surface of the disengaged wafer is dried at ambient temperature for a period of at least about 60 seconds prior to contacting the polished surface of the wafer with the subsequent process liquid.

4. A method as set forth in claim 1 wherein the polished surface of the disengaged wafer is dried at ambient temperature for a period of at least about 120 seconds prior to contacting the polished surface of the wafer with the subsequent process liquid.

5. A method as set forth in claim 1 further including applying an acidic quench solution comprising an organic or inorganic acid to the wafer to neutralize the polishing solution.

6. A method as set forth in claim 5 wherein the acidic quench solution further comprises the surfactant such that the organic or inorganic acid and the surfactant are applied to the polished surface of the wafer simultaneously while the wafer is engaged on the polishing pad, the subsequent process liquid comprising a rinse media.

7. A method as set forth in claim 1 wherein the surfactant is applied to the polished surface of the wafer after the wafer is disengaged from the polishing pad.

8. A method as set forth in claim 1 wherein the surfactant comprises a water-soluble, non-ionic polyoxyethylene glycol of the general formula $C_nH_{2n+1}$—$(OCH_2CH_2)_m$—OH, wherein n is from 2 to 18 and m is from 20 to 20,000.

9. A method as set forth in claim 8 wherein the concentration of the surfactant applied to the polished surface of the wafer is from about 0.03 to about 5.0 percent by weight.

10. A method as set forth in claim 8 wherein the concentration of the surfactant applied to the polished surface of the wafer is from about 0.03 to about 1.0 percent by weight.

11. A method as set forth in claim 8 wherein the concentration of the surfactant applied to the polished surface of the wafer is from about 0.1 to about 0.5 percent by weight.

12. A method as set forth in claim 1 wherein the polishing solution comprises a colloidal silica slurry.

13. A method as set forth in claim 12 wherein the polishing solution further comprises an alkaline etchant and an amine accelerant.

14. A method as set forth in claim 13 wherein the polishing solution comprises a caustic solution of the alkaline etchant and amine accelerant having a pH of from about 10 to about 14.

15. A method as set forth in claim 1 wherein the polishing pad is a polyurethane impregnated felt pad.

16. A method of polishing a semiconductor wafer, the method comprising the steps of:

applying a first polishing solution to a first polishing pad;

contacting the first polishing pad and the first polishing solution with a surface of the wafer as the wafer moves relative to the polishing pad to polish the surface of the wafer;

applying an acidic quench solution to the wafer to neutralize the first polishing solution;

applying a water-soluble polyoxyethylene glycol surfactant to the polished surface of the wafer;

disengaging the wafer from the polishing pad;

after application of the surfactant to the polished surface of the wafer, drying the polished surface of the disengaged wafer for a period of at least about 20 seconds prior to contacting the polished surface of the wafer with a rinse media;

applying a second polishing solution to a second polishing pad; and contacting the second polishing pad and the second polishing solution with the rinsed polished surface of the wafer as the wafer moves relative to the polishing pad to further polish the surface of the wafer.

17. A method as set forth in claim 16 wherein the polished surface of the disengaged wafer is dried at ambient temperature for a period of at least about 30 seconds prior to contacting the polished surface of the wafer with the rinse media.

18. A method as set forth in claim 16 wherein the polished surface of the disengaged wafer is dried at ambient temperature for a period of at least about 60 seconds prior to contacting the polished surface of the wafer with the rinse media.

19. A method as set forth in claim 16 wherein the polished surface of the disengaged wafer is dried at ambient temperature for a period of at least about 120 seconds prior to contacting the polished surface of the wafer with the rinse media.

20. A method as set forth in claim 16 wherein the acidic quench solution comprises an organic or inorganic acid and the water-soluble polyoxyethylene glycol surfactant such that the organic or inorganic acid and the surfactant are applied to the polished surface of the wafer simultaneously while the wafer is engaged on the polishing pad.

21. A method as set forth in claim 16 wherein the water-soluble polyoxyethylene glycol surfactant is applied to the polished surface of the wafer after the wafer is disengaged from the polishing pad.

22. A method as set forth in claim 16 wherein the water-soluble polyoxyethylene glycol surfactant comprises a water-soluble, non-ionic polyoxyethylene glycol of the general formula $C_nH_{2n+1}$—$(OCH_2CH_2)_m$—OH, wherein n is from 2 to 18 and m is from 20 to 20,000.

23. A method as set forth in claim 22 wherein the concentration of the water-soluble polyoxyethylene glycol surfactant applied to the polished surface of the wafer is from about 0.03 to about 5.0 percent by weight.

24. A method as set forth in claim 22 wherein the concentration of the water-soluble polyoxyethylene glycol surfactant applied to the polished surface of the wafer is from about 0.03 to about 1.0 percent by weight.

25. A method as set forth in claim 22 wherein the concentration of the water-soluble polyoxyethylene glycol surfactant applied to the polished surface of the wafer is from about 0.1 to about 0.5 percent by weight.

26. A method as set forth in claim 16 wherein the polishing solution comprises a colloidal silica slurry.

27. A method as set forth in claim 26 wherein the polishing solution further comprises an alkaline etchant and an amine accelerant.

28. A method as set forth in claim 27 wherein the polishing solution comprises a caustic solution of the alkaline etchant and amine accelerant having a pH of from about 10 to about 14.

29. A method as set forth in claim 16 wherein the first polishing pad and the second polishing pad are polyurethane impregnated felt pads.

30. A method of polishing a semiconductor wafer, the method comprising the steps of:

applying a polishing solution to a polishing pad;

contacting the polishing pad and the polishing solution with a surface of the wafer as the wafer moves relative to the polishing pad to polish the surface of the wafer;

applying a polyoxyethylene glycol surfactant to the polished surface of the wafer;

disengaging the wafer from the polishing pad; and, forming a substantially continuous hydrophobic layer comprising the polyoxyethylene glycol surfactant across the polished surface of the disengaged wafer.

* * * * *